(12) United States Patent
Cheng et al.

(10) Patent No.: US 11,889,771 B2
(45) Date of Patent: Jan. 30, 2024

(54) MITIGATING MOISTURE DRIVEN DEGRADATION OF SILICON DOPED CHALCOGENIDES

(71) Applicant: International Business Machines Corporation, Armonk, NY (US)

(72) Inventors: Cheng-Wei Cheng, White Plains, NY (US); Huai-Yu Cheng, Pleasantville, NY (US); I-Ting Kuo, Taoyuan (TW); Robert L. Bruce, White Plains, NY (US); Martin Michael Frank, Dobbs Ferry, NY (US); Hiroyuki Miyazoe, White Plains, NY (US)

(73) Assignees: International Business Machines Corporation, Armonk, NY (US); Macronix International Co., Ltd., Hsinchu (TW)

( * ) Notice: Subject to any disclaimer, the term of this patent is extended or adjusted under 35 U.S.C. 154(b) by 407 days.

(21) Appl. No.: 17/136,107

(22) Filed: Dec. 29, 2020

(65) Prior Publication Data

US 2022/0209113 A1 Jun. 30, 2022

(51) Int. Cl.
*H10N 70/00* (2023.01)
*H10B 63/00* (2023.01)
*H10N 70/20* (2023.01)

(52) U.S. Cl.
CPC .......... *H10N 70/041* (2023.02); *H10B 63/24* (2023.02); *H10N 70/231* (2023.02); *H10N 70/826* (2023.02); *H10N 70/8413* (2023.02); *H10N 70/8825* (2023.02); *H10N 70/8828* (2023.02)

(58) Field of Classification Search
CPC .. H10N 70/041; H10N 70/231; H10N 70/826; H10N 70/8413; H10N 70/8825; H10N 70/8828; H10N 70/20; H10N 70/882; H10B 63/24; H10B 63/80
See application file for complete search history.

(56) References Cited

U.S. PATENT DOCUMENTS

| | | |
|---|---|---|
| 5,281,546 A | 1/1994 | Possin et al. |
| 5,723,383 A | 3/1998 | Kosugi et al. |
| 10,367,104 B2 | 7/2019 | Choi et al. |
| 2003/0129117 A1 | 7/2003 | Mills |
| 2006/0172083 A1 | 8/2006 | Lee et al. |
| 2008/0169457 A1* | 7/2008 | Hideki ................. H10N 70/026 257/E45.002 |

OTHER PUBLICATIONS

Huy et al., Hydrogen passivation of the selenium double donor in silicon: A study by magnetic resonance, Physical Review B, vol. 61, No. 11, Mar. 2000, pp. 7448-7458.

(Continued)

*Primary Examiner* — Andrew J. Oyer
(74) *Attorney, Agent, or Firm* — Daniel Morris; Otterstedt & Kammer PLLC

(57) ABSTRACT

A method for mitigating moisture driven degradation of silicon doped chalcogenides includes placing a silicon doped chalcogenide composition in a process chamber, passivating dangling silicon bonds of the silicon doped chalcogenide composition by flooding the process chamber with forming gas or with hydrogen plasma, purging the forming gas or the hydrogen plasma from the process chamber, and removing the passivated silicon doped chalcogenide composition from the process chamber.

20 Claims, 4 Drawing Sheets

(56) References Cited

OTHER PUBLICATIONS

Zhou et al., Highly Selective Adsorption on SiSe Monolayer and Effect of Strain Engineering: A DFT Study, Sensors, vol. 20, No. 4, 2Feb 020, 977, 14 pp.
Ishii et al., Properties of silicon surface cleaned by hydrogen plasma, Applied Physics Letters, vol. 58, No. 13, Apr. 1991, pp. 1378-1380.
Noé, Ovonic threshold switching: new materials and the underlying physical mechanism, https://www.edn.com/ovonic-threshold-switching-ots-new-materials-and-the-underlying-physical-mechanism/, Oct. 2020, pp. 1-11.
Zhou et al., Highly Selective Adsorption on SiSe Monolayer and Effect of Strain Engineering: A DFT Study, Sensors, vol. 20, No. 4, Feb. 2020, 977, pp. 1-14.
Ishii et al., Properties of silicon surface cleaned by hydrogen plasma, Applied Physics Letters, vol. 58, No. 13, Jan. 1991, pp. 1378-1380.
Anonymous, Frequent Asked Questions, IRflex Corporation, Mar. 2020 (Mar. 2020), pp. 1-6.
Noe et al., Ovonic threshold switching: New materials and the underlying physical mechanism, Oct. 2020, pp. 1-5.
Persson, Materials Data on SiSe2 (SG:72) by Materials Project, doi="10.17188/1274334", Jul. 2014, pp. 1-5.

\* cited by examiner

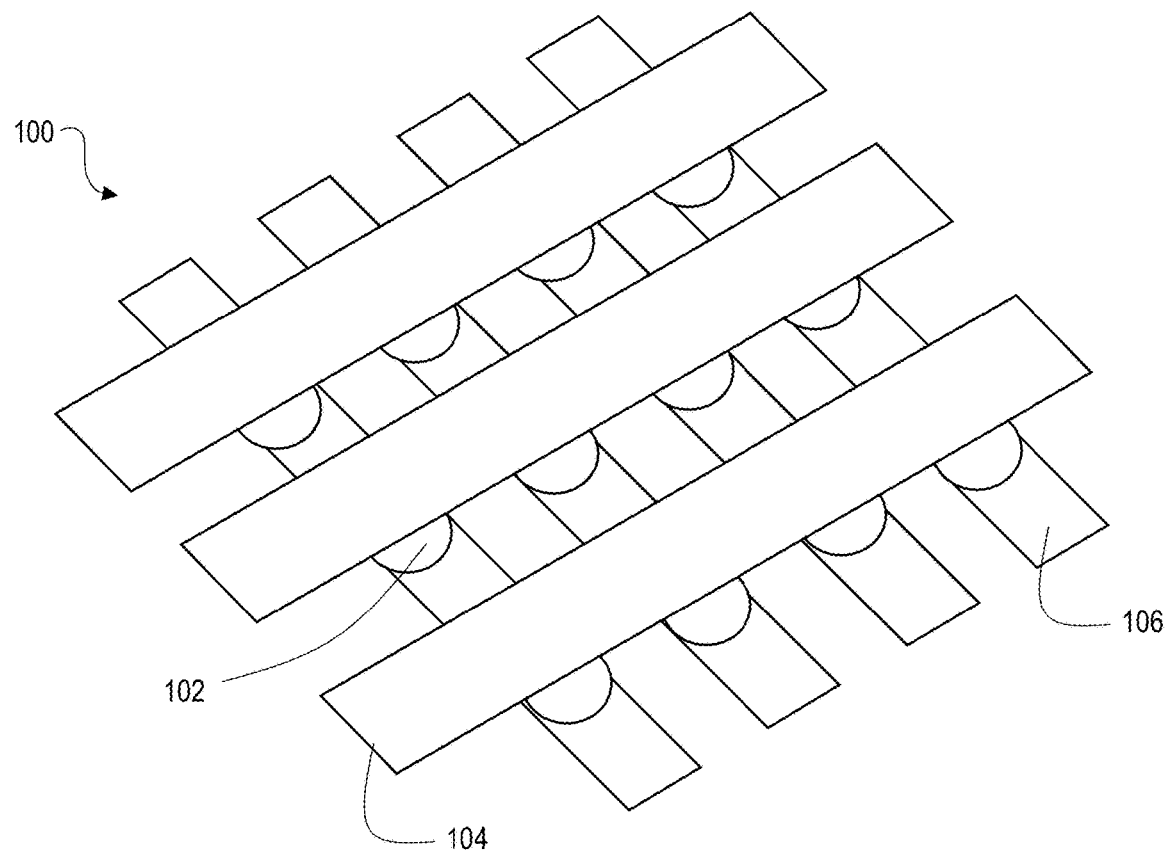
FIG. 1
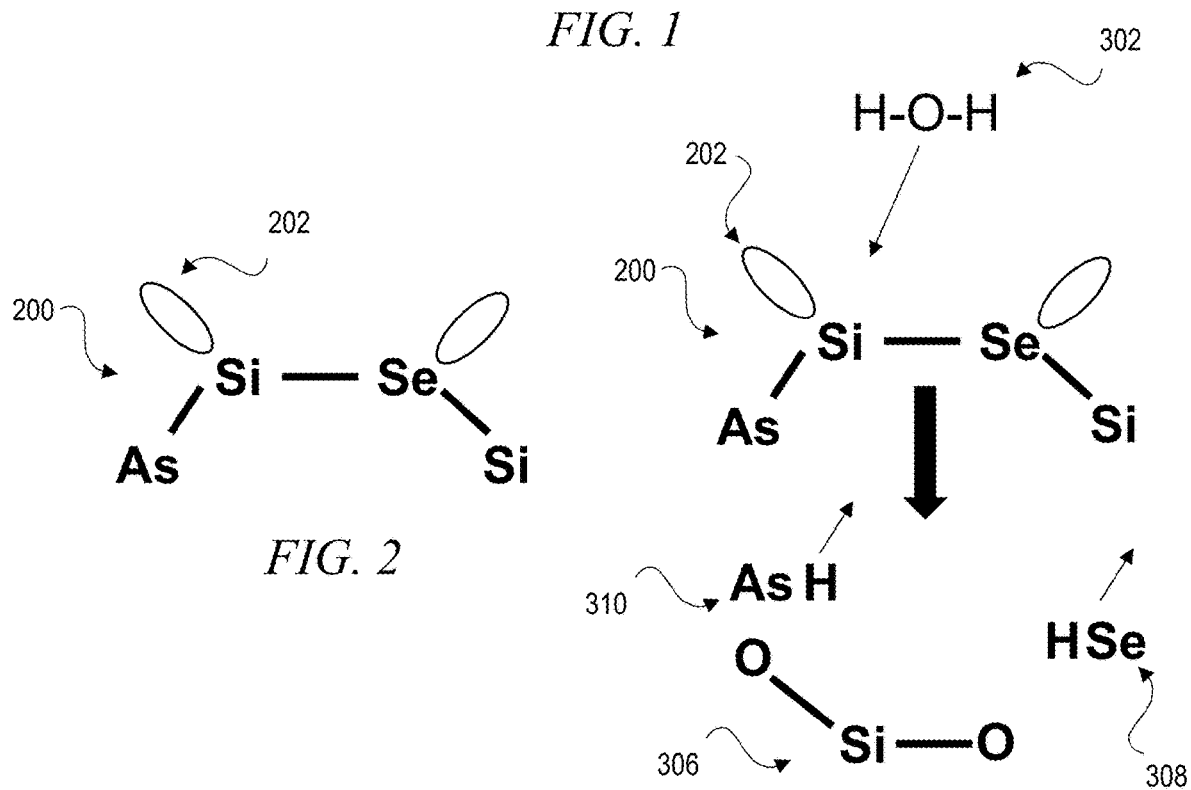
FIG. 2
FIG. 3

MITIGATING MOISTURE DRIVEN DEGRADATION OF SILICON DOPED CHALCOGENIDES

BACKGROUND

The present invention relates to the electrical, electronic, and computer arts, and more specifically, to methods of preparing materials for use in cross-point memory.

For years, scientists have considered the use of cross-point memory and, more recently, such memories have been practically implemented using Phase Change Materials (PCM). Phase-change-memory has been proven to be a good candidate for storage class memories such as cross-point memory.

SUMMARY

Principles of the invention provide techniques for mitigating moisture driven degradation of silicon doped, arsenic doped chalcogenides. In one aspect, an exemplary method includes placing a silicon doped chalcogenide composition in a process chamber, passivating dangling silicon bonds of the silicon doped chalcogenide composition by flooding the process chamber with forming gas, purging the forming gas from the process chamber, and removing the passivated silicon doped chalcogenide composition from the process chamber.

In another aspect, an exemplary method includes placing a silicon doped chalcogenide composition in a process chamber, passivating dangling silicon bonds of the silicon doped chalcogenide composition by flooding the process chamber with hydrogen plasma, purging the hydrogen plasma from the process chamber, and removing the passivated silicon doped chalcogenide composition from the process chamber.

In another aspect, a passivated silicon doped chalcogenide composition has hydrogen atoms occupying silicon bonds that are not attached to chalcogens.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

In view of the foregoing, techniques of the present invention can provide substantial beneficial technical effects. For example, one or more embodiments provide one or more of:

Practical implementation of silicon doped chalcogenides for phase change memory in cross-point arrays, without undesirable off-gassing due to moisture exposure.

Practical implementation of silicon doped chalcogenides for phase change memory in cross-point arrays, without undesirable changes to electrical properties due to moisture exposure.

Principles of the invention provide techniques for not only mitigating moisture driven degradation of silicon doped chalcogenides, but also prevent the materials from outgassing of toxic hydride gases to the environment. This is also beneficial for the safety of environment and people.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings:

FIG. 1 depicts a cross-point memory array using phase change material.

FIG. 2 depicts a generalized chemical structure for a silicon doped chalcogenide phase change material.

FIG. 3 depicts interaction of moisture with the generalized chemical structure of FIG. 2.

DETAILED DESCRIPTION

Figure 4:
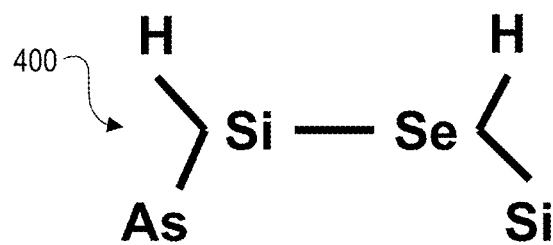
FIG. 4 depicts hydrogen passivation of the generalized chemical structure of FIG. 2, according to an exemplary embodiment.

Principles of the invention provide techniques for mitigating moisture driven degradation of silicon doped chalcogenides.

FIG. 1 depicts a cross-point memory array 100 that has phase change memory (PCM) memory cells, e.g., 102, column elements, e.g., 104, and row elements, e.g., 106. In the particular case of cross-point memory, each memory cell 102 incorporates a chalcogenide as a phase change memory unit 114 (shown in FIG. 8) and incorporates another chalcogenide as an OTS (Ovonic Threshold Switch) selector 110 (also shown in FIG. 8) that enables or disables read/write operations to the phase change memory unit 114. Chalcogenides are materials that include one or more chalcogens (e.g., S, Se, Te) as a substantial constituent in their composition.

The chalcogenide of the phase change memory unit 114 is a PCM that can have amorphous and crystalline phases. A phase change in the PCM is accomplished by supplying a current through a resistive element (e.g., TiN) to heat the PCM briefly and rapidly to switch to the amorphous phase, or slowly and for a longer time to switch to the crystalline phase. The PCM has a relatively high resistance in the amorphous phase, and a relatively low resistance in the crystalline phase.

The chalcogenide of the OTS selector 110 (see FIG. 8) is a material that transitions between an off-state (relatively resistive) and on-state (relatively conductive), according to an applied voltage. That is, when the voltage applied to the OTS selector 110 exceeds a threshold voltage $V_{th}$, the chalcogenide material experiences a sharp drop in resistivity, enabling a current flow. When the voltage is removed, the chalcogenide material recovers a highly-resistive state.

According to some embodiments, the PCM and OTS material are both chalcogenide materials, where the PCM crystallizes when heated, while the OTS material remains in an amorphous phase when heated.

Referring again to FIG. 1, the PCM memory cells 102 include a passivated silicon doped chalcogenide prepared according to one or more embodiments of the present invention. For example, a passivated silicon doped chalcogenide can be used as an OTS selector 110 (shown in FIG. 8). In other applications, a similarly passivated silicon doped chalcogenide can be used as a PCM of a phase change memory unit 114 (also shown in FIG. 8).

According to some embodiments, the passivated silicon doped chalcogenide exhibits improved electrical properties. Doping the chalcogenides with silicon improves the thermal stability, threshold voltage, leakage current, etc., of the material. According to at least one embodiment, passivating the chalcogenide material stabilizes its characteristics against moisture-driven degradation.

A chalcogenide is a chemical compound including at least one chalcogen anion and at least one more electropositive element. An exemplary chemical formula for an arsenic-doped chalcogenide suitable for one or more embodiments of the present invention is SiAsSe. Other exemplary materials include SiGeAsSe, SiGeAsSeTe, SiGeAsSbSe, and SiGeAsSbSeTe.

FIG. 2 depicts a chemical structure 200 for a silicon doped, arsenic-doped chalcogenide (SiSe(As)). Note the standard chemical notation: silicon (Si), selenium (Se), arsenic (As), etc. The ovals, e.g., 202, represent free or dangling bonds. A dangling bond is an unsatisfied valence on an immobilized atom. These dangling bonds are reactive, and can lead to defects and/or impurities in the material.

Although conventional arsenic-chalcogenide glass fibers generally have high stability to atmospheric moisture, we have discovered that exposing silicon-doped chalcogenides to moisture results in chemical degradation of the composition. For example, in a case where a silicon doped chalcogenide is exposed to moisture after thin film deposition or processing, this degradation produces compounds such as hydrogen selenide or (when the chalcogenide is arsenic-doped) arsine gas with its distinctive garlic odor, as well as adversely affecting the desirable electrical properties of the composition. FIG. 3 depicts interaction of moisture 302 with the chemical structure 200 of FIG. 2, according to:

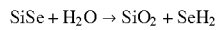

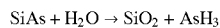

As shown in FIG. 3, the oxygen atoms in the moisture 302 react at the dangling bond 202 of the arsenic bonded silicon, extracting the silicon from the structure 200, and forming silicon dioxide ($SiO_2$) 306 because $SiO_2$ has a significantly lower free energy than water ($H_2O$); in fact, the Gibbs free energy of $SiO_2$ is on the order of –856 kJ/mol (kilojoule per mole) whereas the free energy of water is only about –229 kJ/mol in the gas phase. Once the oxygen has reacted with the silicon, this creates dangling bonds from the chalcogens and/or arsenic that previously were attached to the oxygen. The freed ionic hydrogen atoms from the moisture 302 are then available to attach to the dangling bonds of the chalcogen, e.g., selenium, and/or the arsenic, forming hydrogen selenide ($H_2Se$) 308 and/or arsine ($AsH_3$) 310.

Thus, moisture driven degradation of silicon doped chalcogenides occurs because in the natural state of such a composition the silicon atoms in the composition have dangling bonds that preferentially react with the oxygen atoms of water molecules to produce silicon dioxide and release the ionic hydrogen from the water molecules. The ionic hydrogen then reacts with the chalcogen (e.g., selenium), or with other constituents (e.g., arsenic) to produce gases (e.g., hydrogen selenide, arsine), which can be toxic.

According to some embodiments, dangling bonds of the arsenic bonded silicon atoms and the selenium atoms of a silicon doped chalcogenide composition can be passivated by exposing the composition to a hydrogen atmosphere. For a forming gas passivation process according to one or more embodiments of the present invention, this process can be accomplished with materials under a pressure of about 14 psi (pound per square inch) (1 atm (atmospheres)) to 280 psi (20 atm) and a temperature between about 200° C. (Celsius) to 400° C. For a hydrogen plasma treatment, this process can be accomplished with materials under a pressure of about 1 to 100 torrs (Torr) and a temperature between about room temperature to 100° C.

FIG. 4 depicts a hydrogen passivated chemical structure 400 according to some embodiments of the present invention. The hydrogen passivated chemical structure 400 does not include dangling bonds.

Figure 5:
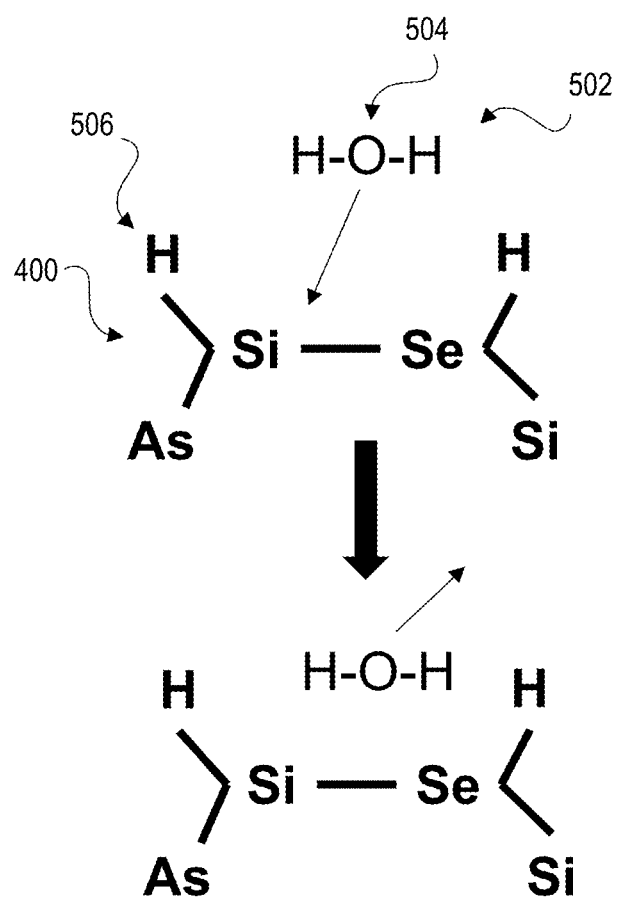
FIG. 5 depicts non-interaction of moisture with the passivated chemical structure of FIG. 4.

FIG. 5 depicts the non-interaction of moisture 502 with the passivated chemical structure 400 of FIG. 4. Note that the oxygen 504 of the moisture 502 does not react with the hydrogen passivated chemical structure 400, which includes hydrogen atoms, e.g., 506, attached to the silicon and selenium of the doped composition. More particularly, the oxygen of the moisture 502 is not reactive with the hydrogen passivated chemical structure 400.

Figures 6, 7:
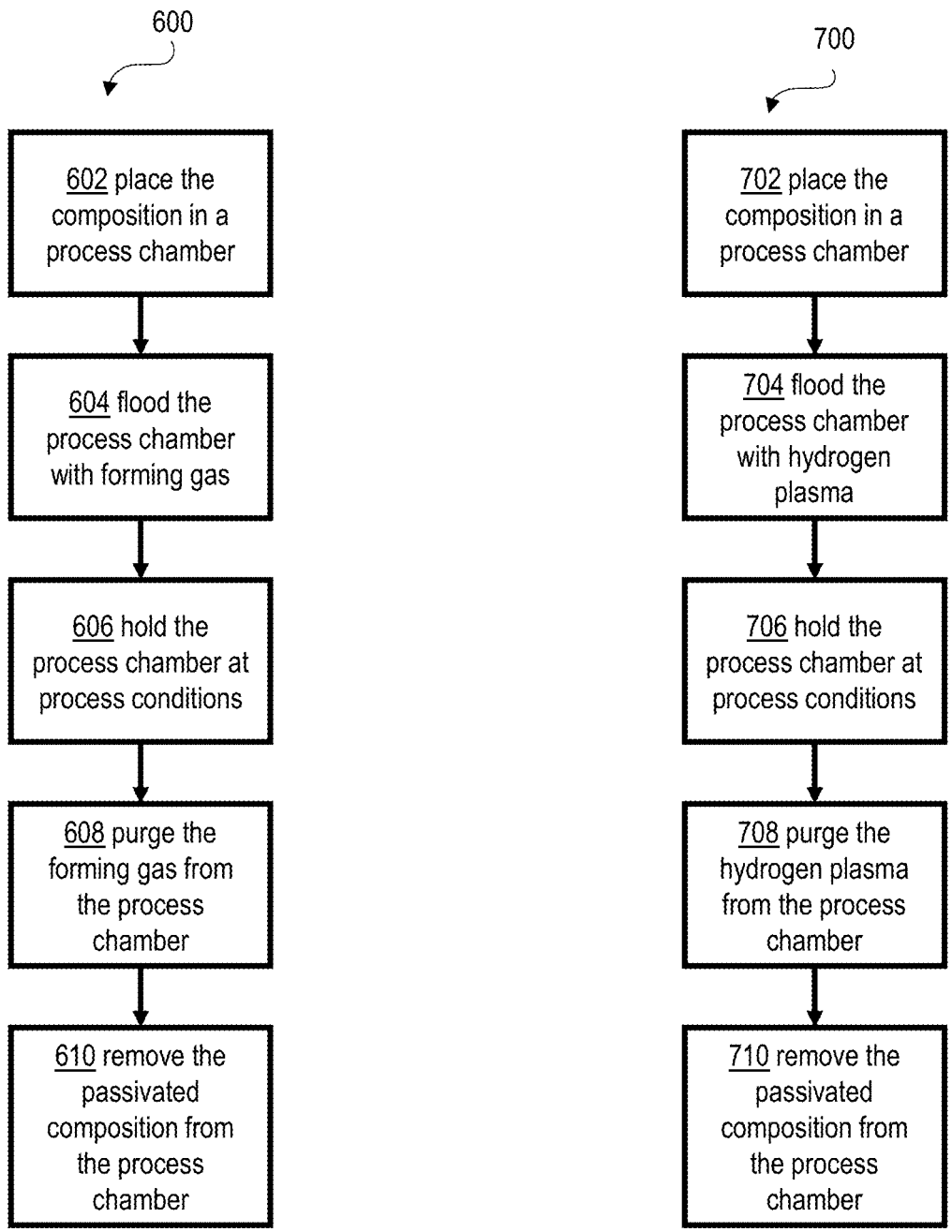
FIG. 6 depicts in a flowchart a method for hydrogen passivating a silicon doped chalcogenide composition, according to an exemplary embodiment.
FIG. 7 depicts in a flowchart a method for hydrogen passivating a silicon doped chalcogenide composition, according to an exemplary embodiment.

FIG. 6 depicts in a flowchart a method 600 for hydrogen passivating a silicon doped chalcogenide composition, according to an exemplary embodiment. At 602 the composition is placed in a process chamber. At 604, the process chamber is flooded with forming gas (e.g., dissociated ammonia) containing at least 5 mol % molecular hydrogen with the remainder nitrogen. At 606, the process chamber is held at process conditions, e.g., between 200° C. and 400° C. at between 14 psi and 280 psi for at least 60 seconds. At 608, the forming gas is purged from the process chamber. At 610, the passivated composition is removed from the process chamber.

FIG. 7 depicts in a flowchart a method 700 for hydrogen passivating a silicon doped chalcogenide composition, according to an exemplary embodiment. At 702 the composition is placed in a process chamber. At 704, the process chamber is flooded with a hydrogen plasma, e.g., at least 90% by mass hydrogen. At 706, the process chamber is held at process conditions, e.g., between room temperature and 100° C. at between 1 and 100 Torr for at least 60 seconds. At 708, the hydrogen plasma is purged from the process chamber. At 710, the passivated composition is removed from the process chamber.

According to the methods of FIG. 6 and FIG. 7, there is no oxygen in the forming gas or plasma. Further, the silicon doped chalcogenide preferentially reacts with the hydrogen in the forming gas or plasma, satisfying the dangling bonds 202. The hydrogen in the forming gas or plasma reacts with the chalcogens to passivate the dangling bonds 202, without removing the chalcogens from the chemical structure.

Figure 8:
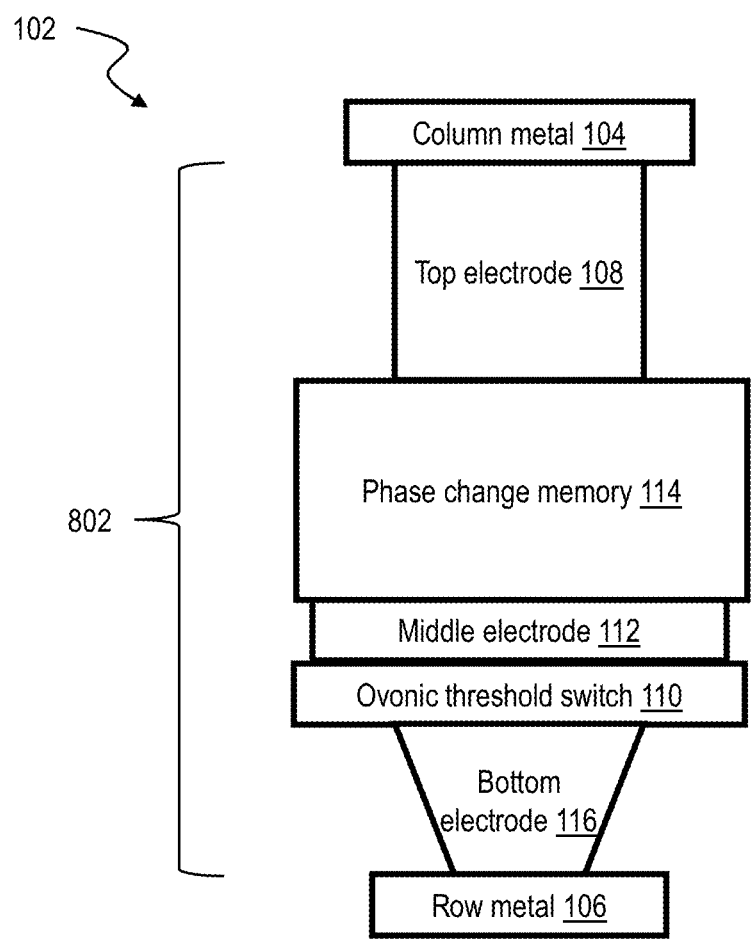
FIG. 8 depicts in a schematic a cross-point memory device incorporating a hydrogen-passivated silicon doped chalcogenide, according to an exemplary embodiment.

According to some embodiments, the passivation is a treatment performed after implementation of the composition into, for example, of a PCM and/or an OTS selector of a PCM memory device. According to some embodiments, the passivation is performed before fully encapsulating the memory devices. FIG. 8 depicts a PCM memory cell 102 according to an exemplary embodiment. The PCM memory cell 102 includes a memory stack 802 that is electrically connected between column metal 104 and row metal 106. The memory stack 802 includes a top electrode 108, an OTS selector 110, a middle electrode 112, a phase change memory unit 114, and a bottom electrode 116. The OTS selector 110 and/or the phase change memory unit 114 each incorporate a hydrogen-passivated silicon doped chalcogenide having generally the chemical structure 400 shown in FIG. 4.

In operation of the PCM memory cell 102, a column voltage is supplied to the column metal 104 and a row voltage is supplied to the row metal 106. When a difference between the row and column voltages exceeds the threshold voltage $V_{th}$ of the OTS selector 110, current flows through the memory stack 802.

For a WRITE cycle, the row and column voltages are set so that the flowing current exceeds a threshold current of the phase change memory unit 114, and the phase change memory unit 114 is heated above its phase transition temperature. Once the phase change memory unit 114 exceeds its phase transition temperature, there are two options: 1) remove the row and column voltages, in which case the current stops flowing and the phase change memory rapidly cools to an amorphous (high resistance) phase; or 2) maintain the row and column voltages for a certain period of time, in which case the current continues flowing and the phase change memory stabilizes in a crystalline (lower resistance) phase.

For a READ cycle, the row and column voltages are set so that the flowing current does not exceed the threshold current; then the current, which varies according to the resistance of the phase change memory unit 114, is read as the value of the memory cell. Because the resistance of the phase change memory unit 114 is analog (it varies according to how long the phase change memory unit 114 is held above the phase transition temperature), PCM cells enable denser data storage than is achievable with older types of memory.

Recapitulation:

Given the discussion thus far, it will be appreciated that, in general terms, an exemplary method 600, according to an aspect of the invention, includes at 602 placing a silicon doped chalcogenide composition 200 in a process chamber, at 604 passivating dangling silicon bonds of the silicon doped chalcogenide composition by flooding the process chamber with forming gas, at 608 purging the forming gas from the process chamber, and at 610 removing the passivated silicon doped chalcogenide composition 400 from the process chamber. In one or more embodiments, the forming gas contains at least 5 mol % hydrogen. In one or more embodiments, the method further comprises at 606 holding the silicon doped chalcogenide composition in the flooded process chamber at 200° C.-400° C. for at least 1 minute. In one or more embodiments, the method further comprises at 606 holding the silicon doped chalcogenide composition in the flooded process chamber at 14-280 psi for at least 1 minute.

According to another aspect, an exemplary method 700 includes at 702 placing a silicon doped chalcogenide composition 200 in a process chamber, at 704 passivating dangling silicon bonds of the silicon doped chalcogenide composition by flooding the process chamber with a hydrogen plasma, at 708 purging the hydrogen plasma from the process chamber, and at 710 removing the passivated silicon doped chalcogenide composition 400 from the process chamber. In one or more embodiments, the plasma contains at least 90% by mass hydrogen. In one or more embodiments, the method further comprises at 706 holding the silicon doped chalcogenide composition in the flooded process chamber at room temperature for at least 1 minute. In one or more embodiments, the method further comprises at 706 holding the silicon doped chalcogenide composition in the flooded process chamber at 1-100 Torr for at least 1 minute. In one or more embodiments, the method further comprises at 706 holding the silicon doped chalcogenide composition in the flooded process chamber at 100° C. for at least 1 minute.

According to another aspect, a passivated silicon doped chalcogenide composition 400 has hydrogen atoms occupying silicon bonds that are not attached to chalcogens. In one or more embodiments, a chemical formula of the composition comprises HSiAsSe. In one or more embodiments, a chemical formula of the composition comprises HSiGeAsSe. In one or more embodiments, a chemical formula of the composition comprises HSiGeAsSeTe. In one or more embodiments, a chemical formula of the composition comprises HSiGeAsSbSe. In one or more embodiments, a chemical formula of the composition comprises HSiGeAsSbSeTe.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A passivated silicon doped chalcogenide composition in which hydrogen atoms occupy silicon bonds that are not attached to chalcogens.

2. The composition of claim 1 wherein a chemical formula of the composition comprises HSiAsSe.

3. The composition of claim 1 wherein a chemical formula of the composition comprises HSiGeAsSe.

4. The composition of claim 1 wherein a chemical formula of the composition comprises HSiGeAsSeTe.

5. The composition of claim 1 wherein a chemical formula of the composition comprises HSiGeAsSbSe.

6. The composition of claim 1 wherein a chemical formula of the composition comprises HSiGeAsSbSeTe.

7. A method of forming a passivated silicon doped chalcogenide composition in which hydrogen atoms occupy silicon bonds that are not attached to chalcogens, the method comprising:
   placing a silicon doped chalcogenide composition in a process chamber;
   passivating dangling silicon bonds of the silicon doped chalcogenide composition by flooding the process chamber with forming gas;
   purging the forming gas from the process chamber; and
   removing the passivated silicon doped chalcogenide composition from the process chamber, wherein, in the passivated silicon doped chalcogenide composition, hydrogen atoms occupy silicon bonds that are not attached to chalcogens.

8. The method of claim 7 wherein the forming gas contains at least 5 mol % hydrogen.

9. The method of claim 8 further comprising holding the silicon doped chalcogenide composition in the flooded process chamber at 200° C. to 400° C. for at least 1 minute.

10. The method of claim 9 further comprising holding the silicon doped chalcogenide composition in the flooded process chamber at 14-280 psi for at least 1 minute.

11. The method of claim 7 further comprising holding the silicon doped chalcogenide composition in the flooded process chamber at 200° C. to 400° C. for at least 1 minute.

12. The method of claim 7 further comprising holding the silicon doped chalcogenide composition in the flooded process chamber at 14-280 psi for at least 1 minute.

13. The method of claim 12 further comprising holding the silicon doped chalcogenide composition in the flooded process chamber at 200° C. to 400° C. for at least 1 minute.

14. A method of forming a passivated silicon doped chalcogenide composition in which hydrogen atoms occupy silicon bonds that are not attached to chalcogens, the method comprising:
   placing a silicon doped chalcogenide composition in a process chamber;
   passivating dangling silicon bonds of the silicon doped chalcogenide composition by flooding the process chamber with a hydrogen plasma;
   purging the hydrogen plasma from the process chamber; and
   removing the passivated silicon doped chalcogenide composition from the process chamber, wherein, in the passivated silicon doped chalcogenide composition, hydrogen atoms occupy silicon bonds that are not attached to chalcogens.

15. The method of claim 14 wherein the plasma contains at least 90% by mass hydrogen.

16. The method of claim 15 further comprising holding the silicon doped chalcogenide composition in the flooded process chamber at room temperature for at least 1 minute.

17. The method of claim 16 further comprising holding the silicon doped chalcogenide composition in the flooded process chamber at 1-100 Torr for at least 1 minute.

18. The method of claim 14 further comprising holding the silicon doped chalcogenide composition in the flooded process chamber at room temperature for at least 1 minute.

19. The method of claim 14 further comprising holding the silicon doped chalcogenide composition in the flooded process chamber at 1-100 Torr for at least 1 minute.

20. The method of claim 19 further comprising holding the silicon doped chalcogenide composition in the flooded process chamber at 100° C. for at least 1 minute.

* * * * *